(12) United States Patent
Johnson

(10) Patent No.: US 6,836,130 B2
(45) Date of Patent: Dec. 28, 2004

(54) METHOD AND APPARATUS FOR WAFER SCALE TESTING

(76) Inventor: Morgan T. Johnson, 2370 SW. Cedar, Portland, OR (US) 97205

( * ) Notice: Subject to any disclaimer, the term of this patent is extended or adjusted under 35 U.S.C. 154(b) by 0 days.

(21) Appl. No.: 10/633,011

(22) Filed: Aug. 1, 2003

(65) Prior Publication Data

US 2004/0027151 A1 Feb. 12, 2004

Related U.S. Application Data

(63) Continuation of application No. 10/176,571, filed on Jun. 21, 2002, now Pat. No. 6,737,879.
(60) Provisional application No. 60/300,318, filed on Jun. 21, 2001.

(51) Int. Cl.[7] .............................................. G01R 31/02

(52) U.S. Cl. ..................................................... 324/755

(58) Field of Search ............................ 324/158.1, 435, 324/115, 755, 750, 537, 757, 758, 759, 760, 763; 361/734; 438/14, 17

(56) References Cited

U.S. PATENT DOCUMENTS

| | | | | |
|---|---|---|---|---|
| 4,628,991 A | * | 12/1986 | Hsiao et al. | ................ 165/80.4 |
| 6,121,065 A | * | 9/2000 | Wong et al. | ................... 438/17 |

* cited by examiner

Primary Examiner—David A. Zarneke
Assistant Examiner—Trung Q. Nguyen
(74) Attorney, Agent, or Firm—Raymond J. Werner

(57) ABSTRACT

Methods and apparatus are provided for I/O pads of unsingulated integrated circuits, to be connected to electrical equipment. A translator plate is interposed between a wafer and tester. The translator plate includes a substrate having two major opposing surfaces, each surface having terminals disposed thereon, and electrical pathways disposed through the substrate to provide for electrical continuity between at least one terminal on a first surface and at least one terminal on the second surface. The translator plate, when interposed between wafer and tester, makes electrical contact with one or more I/O pads of a plurality of integrated circuits on the wafer, providing an electrical pathway therethrough. An anisotropic conductor is disposed between the wafer and the translator plate. A vibratory mechanism, oriented to provide substantially horizontal vibratory motion to the wafer, may be coupled to the wafer to assist disposing the translator plate and anisotropic conductor over the wafer.

20 Claims, 4 Drawing Sheets

METHOD AND APPARATUS FOR WAFER SCALE TESTING

This non-provisional patent application is a continuation of application Ser. No. 10/176,571, filed Jun. 21, 2002 now U.S. Pat. No. 6,737,879, which claimed the benefit of earlier filed provisional application No. 60/300,318, filed Jun. 21, 2001.

BACKGROUND OF THE INVENTION

1. Field of the Invention

The present invention relates generally to the field of semiconductor manufacturing and more particularly to methods and apparatus for providing wafer scale electrical connections that are particularly useful for testing operations.

2. Background Information

Advances in semiconductor manufacturing processes have resulted in the production of integrated circuits having many millions of transistors as well as other active and passive components. In order to provide for the increased Input/Output (I/O) requirements of such large integrated circuits, the number of I/O pads, or terminals, has increased, while the physical size and the spacing between them (i.e., the pitch) has decreased. As is well-known in this field, many integrated circuits are fabricated at the same time on a substrate which is often referred to as a wafer. These wafers are typically, but not always, formed from a material such as crystalline silicon. The integrated circuits are also referred to in the industry as die, or dice (plural).

Before integrated circuits are provided to customers, and typically before the integrated circuits are packaged, a variety of electrical and functional tests are performed. In order to perform such tests electrical connection must be made with the integrated circuits. Traditionally, such electrical connection is made with the aid of a device referred to as a probe card. The probe tips of the probe card physically contact with the I/O pads of the integrated circuit and provide an electrical pathway between the integrated circuit and various pieces of test equipment which are used to drive the integrated circuit and measure its responses.

What is needed are methods and apparatus for providing cost-effective and reliable means for contacting a large number of I/O pads simultaneously while the integrated circuits are still in wafer form.

SUMMARY OF THE INVENTION

Briefly, methods and apparatus are provided in accordance with the present invention in which the I/O pads of one or more integrated circuits, still in wafer form, are electrically connected to one or more pieces of electrical equipment.

In one embodiment of the present invention, a translator plate is interposed between a wafer and a tester. The translator plate includes a substrate having two major opposing surfaces, each surface having electrical terminals disposed thereon, and electrical pathways disposed through the substrate so as to provide for electrically continuity between at least one electrical terminal on a first surface and at least one electrical terminal on the second surface. The translator plate, when interposed between the wafer and the tester, makes electrical contact with one or more I/O pads of a plurality of integrated circuits on the wafer and provides an electrical pathway therethrough.

In a further aspect of the present invention an anisotropic conductor is disposed between the wafer and the space translator.

In a still further aspect of the present invention, a vibratory mechanism, oriented to provide substantially horizontal vibratory motion to the wafer, is coupled to the wafer during the process of disposing the translator plate and anisotropic conductor over the wafer. In this manner, more reliable electrical connection to the I/O pads is obtained.

BRIEF DESCRIPTION OF THE DRAWINGS

The present invention will be described by way of exemplary embodiments, illustrated in the accompanying drawings in which like references denote similar elements.

DETAILED DESCRIPTION

Figure 1:
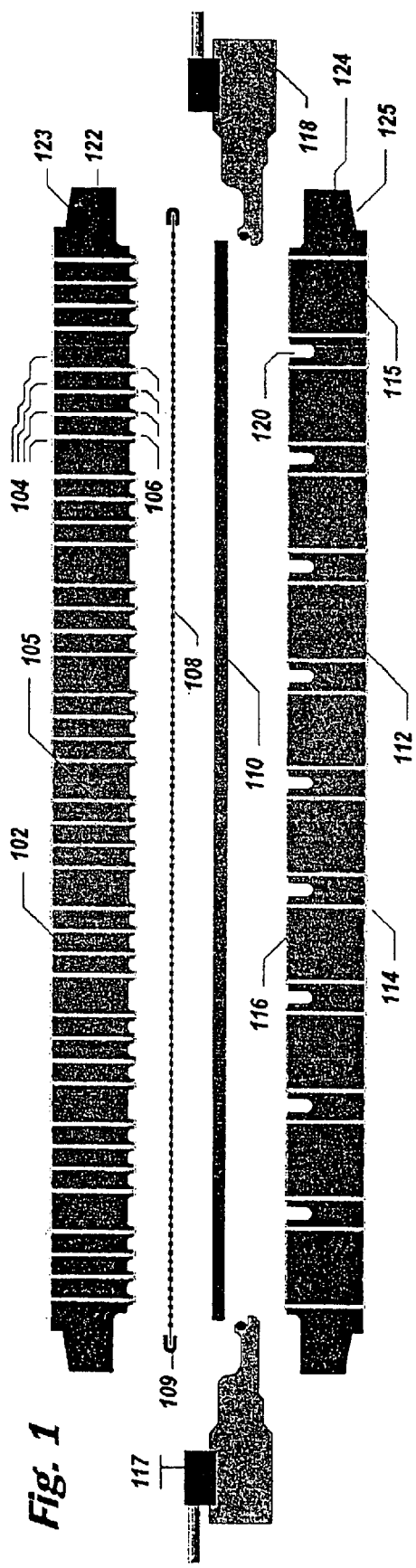
FIG. 1 is an exploded cross-sectional view of a translator plate, an anisotropic conductor, a wafer, a wafer aligner, and a wafer bed.

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well-known features are omitted or simplified in order not to obscure the present invention.

Reference herein to "one embodiment", "an embodiment", or similar formulations, means that a particular feature, structure, or characteristic described in connection with the embodiment, is included in at least one embodiment of the present invention. Thus, the appearances of such phrases or formulations herein are not necessarily all referring to the same embodiment. Furthermore, various particular features, structures, or characteristics may be combined in any suitable manner in one or more embodiments.

The semiconductor industry has, for some time, wanted to do more, and better testing at the wafer level, that is, before the wafer is cut up into individual chips. The industry also desires to do more and better wafer level speed grading, burn-in, characterization and fabrication process feedback. For convenience, all of these processes will be referred to herein as testing because it is generally understood in the industry that electrical testing, speed grading, burn-in, characterization, and so on, are functions typically handled by the testing organizations of the manufacturers.

Wafer level test requires probing the pads of a die before the wafer is sawed into individual dice (sometimes referred to as being singulated).

Another trend and desire in the industry is to accomplish additional wafer level testing in a more parallel fashion such that the pads of more than one integrated circuit are probed during one touchdown (i.e., probe contact). In the context of wafer level testing described herein, integrated circuit refers to an unsingulated die. The motivation for probing more than one integrated circuit at a time is the large cost associated with the testing of integrated circuits. For example, when integrated circuits on a wafer are probed one at a time, depending on die count and length of test, the wafer can take an hour or more to complete. During such testing, the wafer is connected to a wafer prober that may cost hundreds of thousands of dollars, which in turn is connected to a tester that may cost millions of dollars, and which is typically manned by a staff member that of course adds additional cost. This all takes place in an expensive facility. The wafer prober, conditioned power supply rack, tester (including head, lift, cabinets and cables) occupy many square feet. Additionally, such equipment consumes substantial amounts of power.

Wafer probers use "probe cards" to touch down on the pads of an integrated circuit. These wafer probers come in a variety of form factors and technologies. Presently, there are about forty probe card companies around the world. Probe cards may cost from $1,000 to over $100,000. Some suppliers require a minimum purchase. Five probe cards plus a spare is the minimum purchase in one case, and if the probe card cost is $100,000 each, then a $600,000 minimum order is required.

Probe cards have from a few (e.g., 4 or 8) probes to over 3,000 in rare cases. However, there is a growing segment that requires around 1,024 probes. The greater the number of probe pins, the more difficult it is to build such a probe card correctly. Probe cards wear out and therefore are considered a consumable. They often lose alignment or suffer other physical failures such as planarity degradation of probe tips past the point of correction. Probe cards are typically 100% custom for each wafer/die type. Some integrated circuits have 28 pads that must be probed and while others may have hundreds or thousands of pads. Since pad layouts on integrated circuits vary for each particular integrated circuit design, a first die having 28 pads on an 8" wafer will typically have a very different probe card design than a second 28 pad die also on an 8" wafer.

Probe cards must be built for the particular tester/wafer prober combination they are to be used with. Semiconductor testers come in many types, brands and models. Further, some testing is accomplished with custom test equipment (sometimes referred to as "rack and stack") and lacks the standards associated with brands and models. Probe card companies maintain large libraries of "foot prints" and databases of these "standards" for use in designing and fabricating cards.

Virtually all probe cards require maintenance during use. In most cases it is cleaning of the tiny probe tips that contact the pads on the wafers. The probe tips may oxidize, or accumulate particles, both of which cause problems during use in probing. The cleaning of the probe tips requires production testing to be interrupted. Additionally, equipment and skill are also required for cleaning of the probe tips. Probe cards are often discussed in terms of how many "touch downs" are typical between cleaning. Often it can be as few as 50,000 and as many as 1,000,000 touch downs between cleaning. The probe card usually is not removed for cleaning.

Probe cards from time to time require realignment, planarization or repairs. The card must be removed from the test setup for most of these actions further interrupting production test. Rapidly changing factors within the semiconductor industry further aggravate this already complex and difficult reality. Some of these factors are:

Pads on die are shrinking from once standard 0.004" square to as small as 0.002" square. Pad pitch is shrinking from a once minimum of 0.004" pad and 0.004" space or a pitch of 0.008" to 0.0025" pad and 0.002" space for a pitch of 0.0045". Average pad count per die is moving up very rapidly to hundreds. Edges on wave forms are getting very short, measured in picoseconds instead of nanoseconds. Clock rates for I/O cells on the die reach the gigahertz range in CMOS. Signal paths on probe card boards must now have very well matched impedance in every element and transition with a target +/−5%. Signal paths must exhibit very low loss to maintain tester bandwidth. Probes must be very short to reduce parasitic inductances and capacitances. Probe tips should do minimal damage to chip pads. Some chips must be probed more than once in the course of testing and sorting so each touch down should do minimal damage to avoid later difficulty with wire bonding to these pads. High probe counts requiring several ounces per probe tip can be, for example, 1,024 pins at 3 ounces each is almost 200 pounds. In systems attempting to probe 25,000 chip pads at the wafer level, this results in 25,000 die pads at 24 grams each produces almost 1,400 pounds of force, and 80,000 pads equals about 4,300 pounds of force. Product development cycles are shrinking from a year to a few months. Pad positions and pad identities on the new die are frozen for tape-out as little as 3 weeks before wafers are back from a wafer fabrication facility for technical evaluation. Probe cards must be ready for use at the end of that third week or the developers experience delay while waiting for the arrival of the probe card. In probe cards that touch down on several die at once, mechanical alignment must be held to 0.001" across several inches rather than the dimensions of a single die. For example, if the individual die are 0.5" by 0.7" or 0.35 square inches the probe card must have the required accuracy only within that bounded area. If 30 die are to be probed at once the die array is 6 across by 5 deep. Dimensions are 3"×3.5" or 10.5 square inches. This is a very large area to maintain +/−0.001". Large probe cards are very hard to build, maintain, repair and clean.

Probe cards often contain errors connecting the wrong probe tip to a given tester pin. These errors can stem from faulty card layout or incorrect data. If the probe cards must be re-done the cost can be prohibitive. Moreover, such probe card errors can cause serious schedule problems and may be responsible for adding several weeks to the time frame for product introduction. This is particularly true in view of the fact that complex probe cards can take 12 to 14 weeks to obtain.

Probe cards are, on the whole, not produced by tester companies, wafer prober companies, semiconductor companies, or fabless semiconductor companies. They come from fiercely competing probe card companies and often include have proprietary technology. No standards that would shorten design, layout and fabrication can emerge in this market place.

At least two probe card supply companies have proven that it is possible to build probe cards with 20,000 probes. It is believed that it is possible to build probe cards with even higher numbers of probes. Unfortunately, what has proved difficult, if not impossible, is making such probe cards at low cost and with short lead-times.

Fan-out from the probes to the tester DUT board is a serious problem even at the 1,024 probe level. Probe card companies with excellent probes cannot fan-out from the tight probe pitches to the tester DUT board.

"Space transformer" is another term for fan-out. These limit the success of probe cards as well. Space transformers must be custom made for every probe card and transform the chip pad/probe tip pattern to some larger pitch, preferably regular, larger pad pattern. These are very difficult to rapidly build at a practical cost in the 1,024 pad level.

Briefly, methods and apparatus are provided in accordance with the present invention in which the I/O pads of one or more integrated circuits, still in wafer form, are electrically connected to one or more pieces of electrical equipment.

In one embodiment of the present invention, a space translator is interposed between a wafer and a tester. The space translator includes a substrate having two major opposing surfaces, each surface having electrical terminals disposed thereon, and electrical pathways disposed through the substrate so as to provide for electrically continuity between at least one electrical terminal on a first surface and at least one electrical terminal on the second surface. The space translator, when interposed between the wafer and the tester, makes electrical contact with one or more I/O pads of a plurality of integrated circuits on the wafer and provides an electrical pathway therethrough.

In a further aspect of the present invention an anisotropic conductor is disposed between the wafer and the space translator.

In a still further aspect of the present invention, a vibratory mechanism, oriented to provide substantially horizontal vibratory motion to the wafer, is coupled to the wafer during the process of disposing the space translator and anisotropic conductor over the wafer. In this manner, more reliable electrical connection to the I/O pads is obtained.

Referring to FIG. 1, an exploded cross-sectional view of a translator plate, an anisotropic conductor, a wafer, a wafer aligner, and a wafer bed in accordance with the present invention is shown. More particularly, a translator plate 102 has electrical pathways 105 extending therethrough from a top surface to a bottom surface. Electrical pathways 105 connect with electrical terminals 106, which form a pattern consistent with the I/O pad layout on the integrated circuits (i.e., dice) on wafer 110. Electrical pathways 105 also connect with electrical terminals 104 which may be of a different pitch and layout than electrical terminals 106. Typically electrical terminals 104 are laid out in an arrangement and pitch so as to easily mate with one or more pieces of test equipment. Anisotropic conductor 108 provides electrical conduction in the z-axis, that is, in the direction from wafer 110 to translator plate 102, without any significant conduction laterally. In this way, the various integrated circuits on wafer 110 are not shorted out even though electrical conduction takes place between translator plate 102 and wafer 110. Anisotropic conductor 108 is slightly compressible and therefore acts to compensate for non-planarities in wafer 110 and/or translator plate 102. Anisotropic conductor 108 is held substantially planar by means of frame 109. Wafer aligner 118 is used to align wafer 110 with translator plate 102. Wafer bed 112 may also be referred to as a chuck. Such a wafer bed may or may not include vacuum to hold the wafer. Wafer bed 112, may be supplied with heating elements 116 for controlling the temperature of individual die during testing. Heating elements 116 are typically of the resistive type. Electrical pathways 114, which are disposed through wafer bed 112, provide power to resistive heating elements 116. Wafer bed 112 is provided with isolation grooves 120 in order to reduce thermal conduction between adjacent die. A piezo-electric vibratory mechanism 117 is coupled to wafer aligner 118. Vibratory mechanism 117 provides substantially horizontally oriented mechanical vibration during the process of disposing anisotropic conductor 108 and translator plate 102 over wafer 110. This vibratory motion aids in making good electrical connection by, among other things, helping to remove, or break through oxidation build-up on the I/O pads. For example, aluminum I/O pads tend to form aluminum oxide layers thereon when exposed to the atmosphere, which may interfere with the desired electrical connectivity to the I/O pads. It should be noted that both translator plate 102 and wafer bed 112 are equipped with clamping tabs 122 and 124 respectively. Clamping tabs 122 and 124 have inclined surfaces 123 and 125 respectively as shown in FIG. 1.

Translator plate 102 may be made from a material such as silicon carbide, however any suitable material that provides for electrical insulation, and adequate mechanical strength may be used. Some embodiments of the present invention may provide for a translator plate having a slightly convex shape to provide for greater mechanical stability across its diameter.

Figure 2:
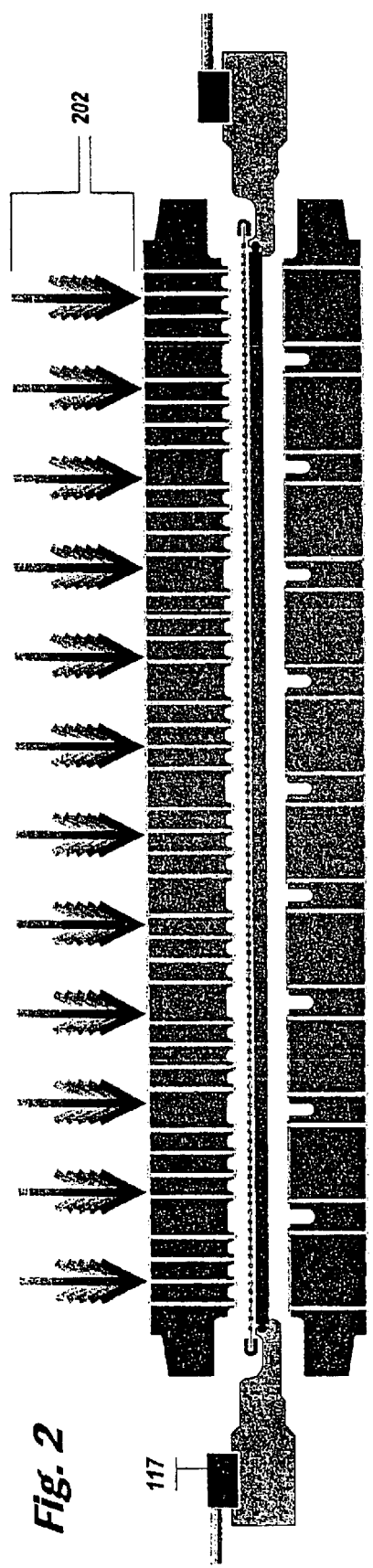
FIG. 2 is a cross-sectional view of a wafer aligner supporting a wafer and an anisotropic conductor disposed thereon, a translator plate being moved into position over the anisotropic conductor, and a wafer bed.

FIG. 2 is a cross-sectional view of wafer aligner 118 supporting wafer 110 and anisotropic conductor 108 disposed thereon, translator plate 102 being moved into position over anisotropic conductor 108, and wafer bed 112. As is shown in the figure, downward forces 202 are applied so that electrical contact is made with the desired low amount of contact resistance.

Figure 3:
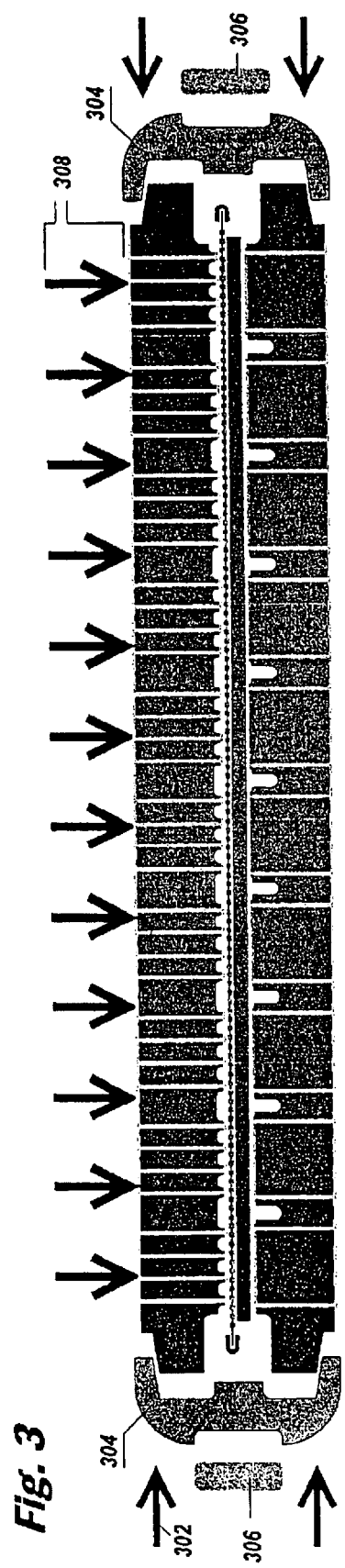
FIG. 3 is a cross-sectional view of a wafer with an anisotropic conductor and a translator plate superjacent thereto, a wafer bed subjacent the wafer, a clamping ring just prior to engagement with the translator plate and wafer bed, and a sealing ring.

FIG. 3 is a cross-sectional view of wafer 110 with anisotropic conductor 108 and translator plate 102 superjacent thereto, wafer bed 112 subjacent wafer 110, a clamping ring 304 just prior to engagement with translator plate 102 and wafer bed 112, and a sealing ring 306. As can been seen in the figure, downward force is still applied to translator plate 102 while clamping ring 304 engages with translator plate 102 and wafer bed 112. Inclined surfaces 123 and 125 of clamping tabs 122 and 124 respectively, engage with clamping ring 304 so as to provide an effective means of maintaining the alignment and connection between the various elements shown. Sealing ring 306 engages with a slot, or groove, along the outer circumference of clamping ring 304.

Figure 4:
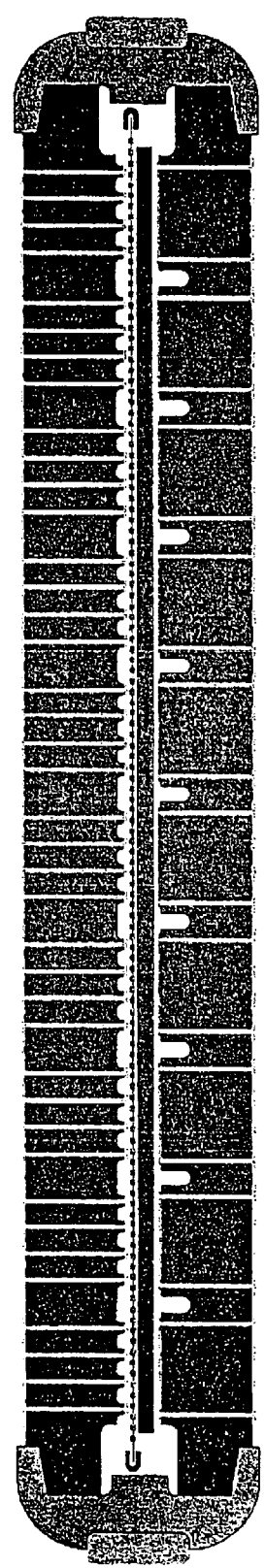
FIG. 4 is a cross-sectional view of a wafer with an anisotropic conductor and a translator plate superjacent thereto, a wafer bed subjacent the wafer, a clamping ring engaged with the translator plate and wafer bed, and a sealing ring around the clamping ring.

FIG. 4 is a cross-sectional view of wafer 110, anisotropic conductor 108 and its frame 109, translator plate 102 superjacent thereto, wafer bed 112 subjacent wafer 110, clamping ring 304 engaged with translator plate 102 and wafer bed 112, and sealing ring 306 fully engaged around clamping ring 304. Either clamping ring 304 or sealing ring 306 may be provided with an RF ID tag or other suitable means for supporting, or facilitating, inventory control and manufacturing process flow.

Conclusion

Thus, it can be seen from the above descriptions that methods and apparatus for wafer scale electrical connection and testing have been described.

While the present invention has been described in terms of the above-described embodiments, those skilled in the art will recognize that the invention is not limited to the embodiments described. The present invention can be practiced with modification and alteration within the spirit and scope of the subjoined claims.

What is claimed is:

1. A method of wafer level testing, comprising:
   disposing a wafer onto a chuck such that a first major surface of the wafer is adjacent the chuck;

disposing an anisotropic conductor onto a second major surface of the wafer, the second major surface of the wafer having a plurality of integrated circuits formed thereon, each of the integrated circuits having a plurality of pads;

disposing a first major surface of a translator plate onto the anisotropic conductor, such that an electrical pathway is established between at least one of the plurality of pads of each of at least two of the plurality of integrated circuits, and corresponding electrical contact pads on a second major surface of the translator plate;

engaging a clamping ring with the chuck and the translator plate;

electrically coupling the corresponding electrical contact pads to a first tester; and applying electrical signals from the first tester to the at least two integrated circuits;

wherein applying electrical signal comprises providing power.

2. The method of claim 1, wherein the at least two integrated circuits each have a pad layout that is the same.

3. The method of claim 1, wherein the anisotropic conductor compensates for non-planarities of the wafer and the translator plate.

4. The method of claim 3, wherein the chuck and the translator plate each include at least one clamping tab.

5. The method of claim 4 wherein the at least one clamping tab of the chuck has an upper surface and a lower surface and the lower surface is an inclined surface.

6. The method of claim 5 the at least one clamping tab of the translator plate has an upper surface and a lower surface and the upper surface is an inclined surface.

7. The method of claim 6, wherein the clamping ring has an inner surface adapted to receive the at least one clamping tab of the chuck and the at least one clamping tab of the translator plate.

8. The method of claim 7, wherein the inner surface of the clamping ring includes an upper portion adapted to make planar contact with the inclined surface of the at least one clamping tab of the translator plate, and further includes a lower portion adapted to make planar contact with the inclined surface of the at least one clamping tab of the chuck.

9. The method of claim 1, wherein the anisotropic conductor is compressible.

10. The method of claim 1, wherein the chuck has isolation grooves formed in the surface thereof.

11. The method of claim 10, wherein the isolation grooves reduce thermal conduction between adjacent ones of the plurality of integrated circuits.

12. The method of claim 11, further comprising heating one or more of the plurality of integrated circuits.

13. A method of wafer level testing, comprising:

disposing a wafer onto a first surface of a chuck such that a first surface of the wafer is adjacent the first surface of the chuck, the first surface of the chuck having isolation grooves therein;

disposing a first surface of a translator plate over a second surface of the wafer, the second surface of the wafer having a plurality of integrated circuits formed thereon, each of the integrated circuits having a plurality of pads, such that an electrical pathway is established between at least one of the plurality of pads of each of at least two of the plurality of integrated circuits, and corresponding electrical contact pads on a second surface of the translator plate;

electrically coupling the corresponding electrical contact pads to a first tester; and applying electrical signals from the first tester to the at least two integrated circuits;

wherein the isolation grooves reduce the thermal conduction between adjacent ones of the plurality of integrated circuits.

14. The method of claim 13, further comprising providing substantially horizontally oriented mechanical vibration to an anisotropic conductor while disposing the anisotropic conductor over the wafer.

15. The method of claim 14, wherein providing substantially horizontally oriented mechanical vibration comprises operating a piezo-electric vibratory mechanism.

16. An apparatus, comprising:

a chuck having a first surface with isolation grooves therein, the first surface of the chuck adapted to receive a wafer thereon;

a translator plate comprising a substrate having a plurality of electrical contacts on a first surface, a corresponding plurality of electrical contacts on a second opposing surface, and a plurality of electrically conductive pathways therethrough to provide electrical continuity between the plurality of electrical contacts on the first surface and the corresponding plurality of electrical contacts on the second opposing surface; and a clamping ring engaged with the chuck and the translator plate such that the chuck and translator plate are held in a fixed spatial relationship with each other.

17. The apparatus of claim 16, wherein the chuck includes at least two clamping tabs, the translator plate includes at least two clamping tabs, and wherein the clamping ring is engaged with the at least two clamping tabs of the chuck and with the at least two clamping tabs of the translator plate; and further comprising a sealing ring disposed around at least a portion of the clamping ring.

18. The apparatus of claim 17, wherein the plurality of electrical contacts on the first surface of the translator plate have a first layout and the corresponding plurality of electrical contacts on the second opposing surface of the translator plate have a second layout, and the first layout and the second layout are different from each other.

19. A method of forming a portable assembly including a wafer, the assembly suitable for repeated testing of the wafer while preserving the integrity of the bonding pads, the method comprising:

disposing a wafer onto a chuck such that a first surface of the wafer is adjacent the chuck, the chuck having isolation grooves therein;

disposing an anisotropic conductor onto a second surface of the wafer, the second surface of the wafer having a plurality of integrated circuits formed thereon, each of the integrated circuits having a plurality of pads;

disposing a first surface of a translator plate onto the anisotropic conductor, such that an electrical pathway is established between at least one of the plurality of pads of each of at least two of the plurality of integrated circuits, and corresponding electrical contact pads on a second surface of the translator plate;

engaging a clamping ring with the chuck and the translator plate;

electrically coupling the corresponding electrical contact pads to a first tester; and performing at least one electrical test on at least one of the plurality of integrated circuits.

20. The method of claim 19, further comprising electrically decoupling the corresponding electrical contact pads from the first tester; moving the portable assembly; electrically coupling the corresponding electrical contact pads to a the second tester; and performing at least one electrical test on at least one of the plurality of integrated circuits.

* * * * *